United States Patent [19]
Wyatt

[11] 4,096,970
[45] Jun. 27, 1978

[54] METHODS OF AND APPARATUS FOR HANDLING ARRAYS OF PARAMAGNETIC ARTICLES

[75] Inventor: Kenneth L. Wyatt, Oklahoma City, Okla.

[73] Assignee: Western Electric Company, Incorporated, New York, N.Y.

[21] Appl. No.: 783,116

[22] Filed: Mar. 31, 1977

[51] Int. Cl.² .............................................. B07C 1/06
[52] U.S. Cl. ...................................... 221/264; 209/73
[58] Field of Search ............... 221/212, 264, 266, 277; 198/33; 209/73

[56] References Cited
U.S. PATENT DOCUMENTS

| 3,388,795 | 6/1968 | Beroset et al. | 209/73 |
| 3,537,580 | 11/1970 | Beroset et al. | 209/73 |

Primary Examiner—Stanley H. Tollberg
Attorney, Agent, or Firm—K. R. Bergum; R. P. Miller

[57] ABSTRACT

Several methods and apparatus are disclosed for successively loading a predetermined number of elongated paramagnetic articles out of a temporarily stored mass thereof, initially confined within a magnetic field-defined storage area in parallel relationship, into precisely spaced arrays, with each array thereafter being transferred to an unloading station whereat the articles are simultaneously released to fall by gravity into respectively aligned receiving areas of an associated workpiece positioned therebelow. As a common, reciprocally mounted, article handling mechanism is employed to carry out the loading, transferring and unloading operations, and as no inversion of the articles is required to effect the unloading thereof, the composite apparatus advantageously is of simplified, reliable and rugged construction.

41 Claims, 10 Drawing Figures

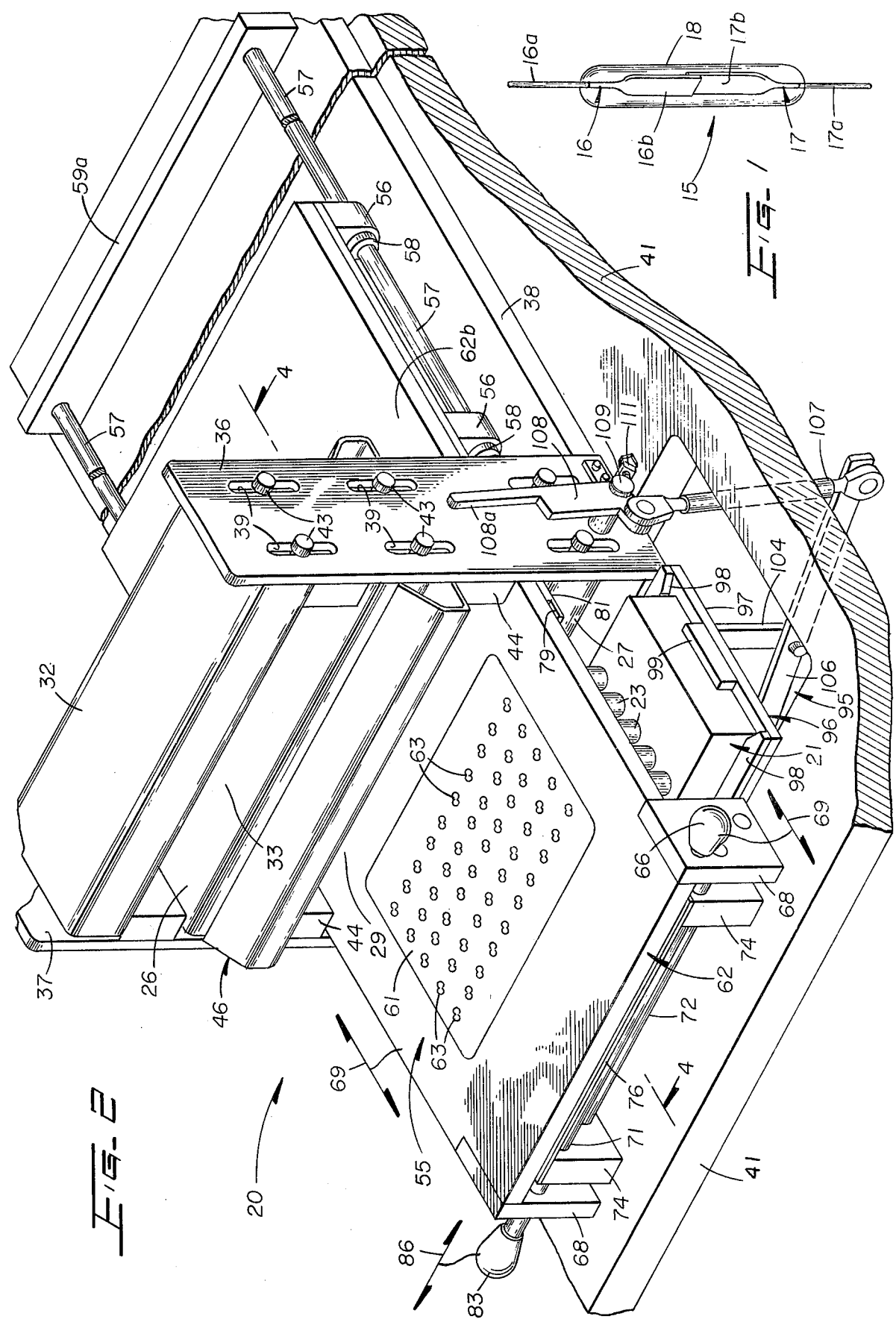

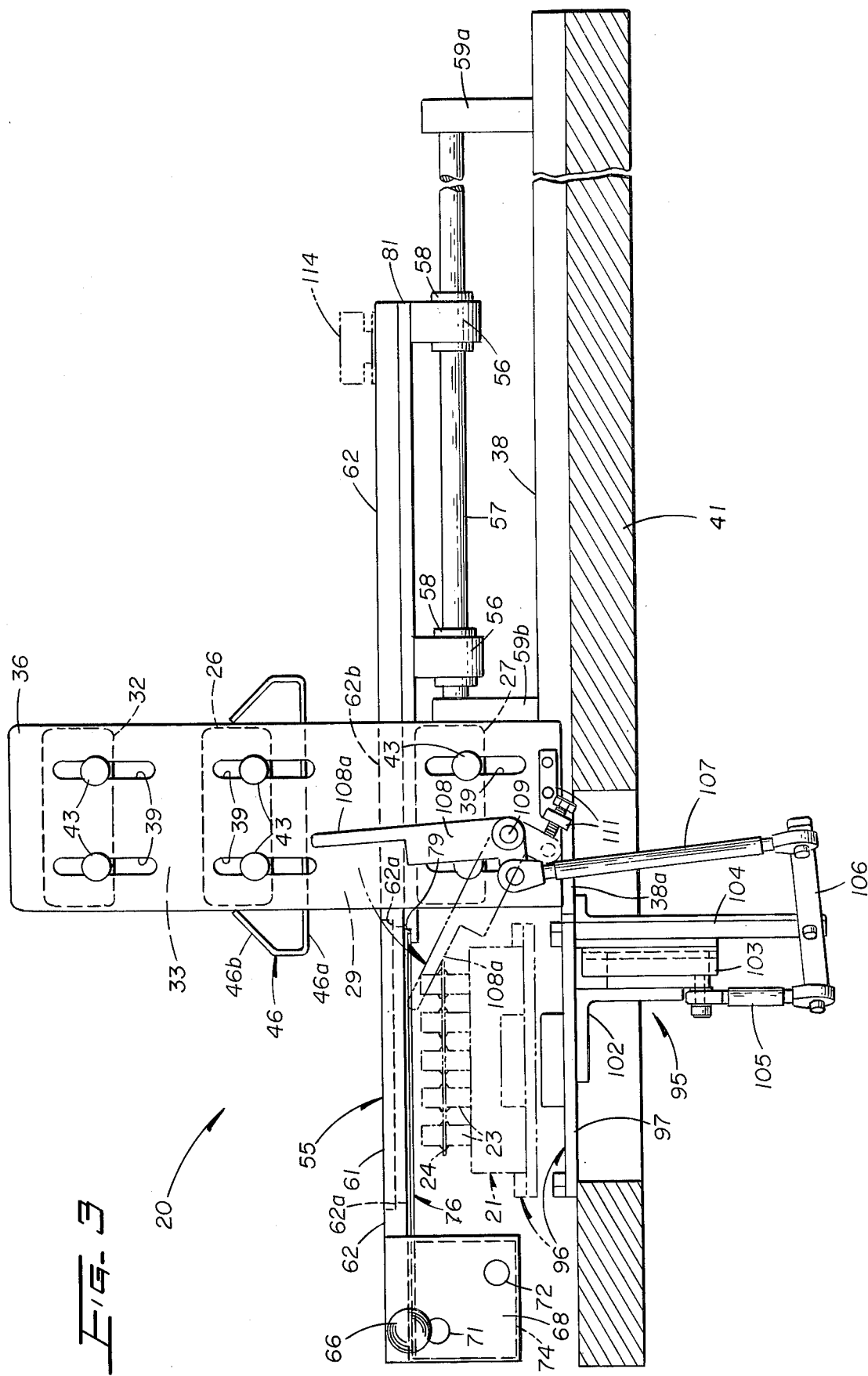

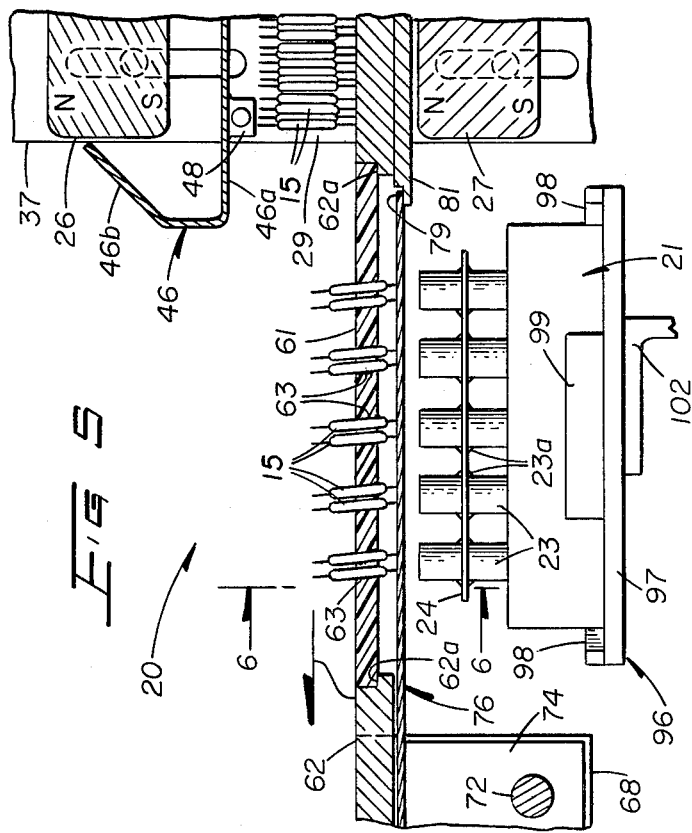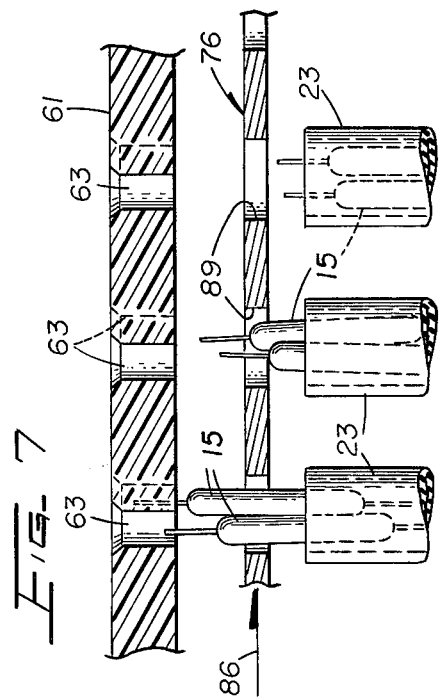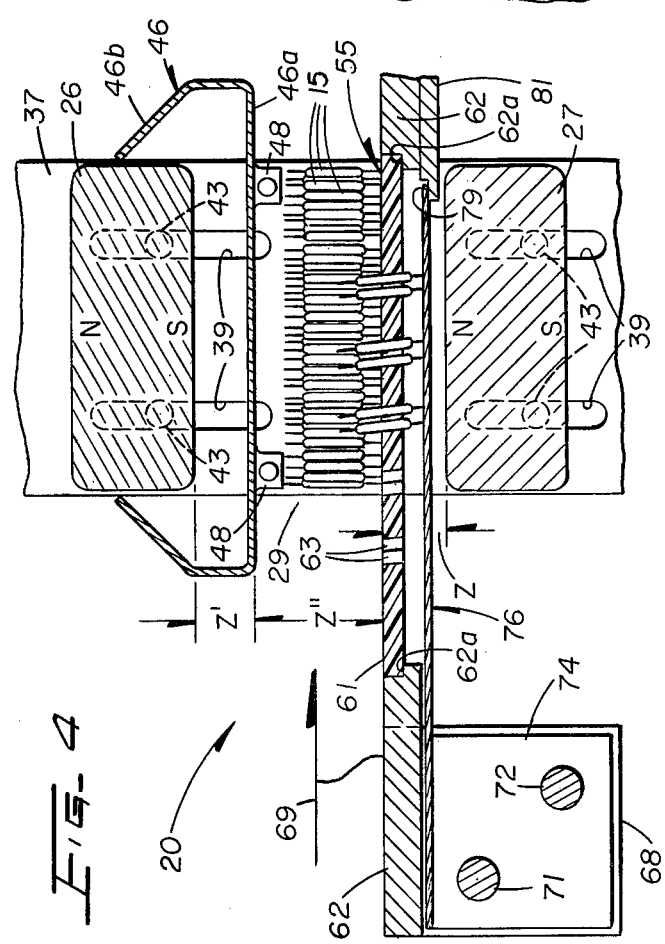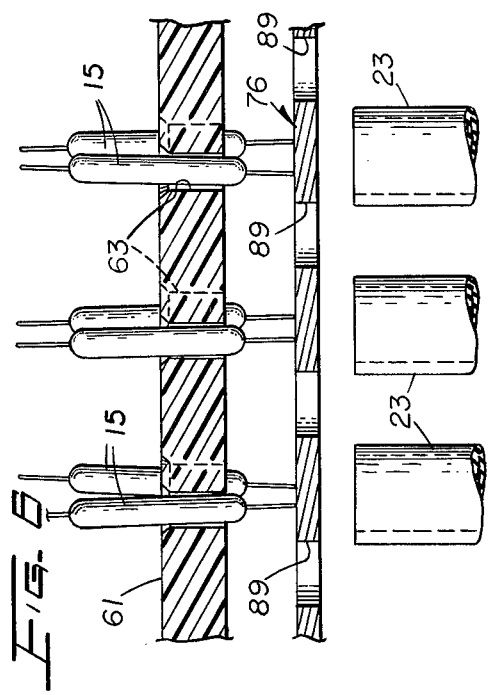

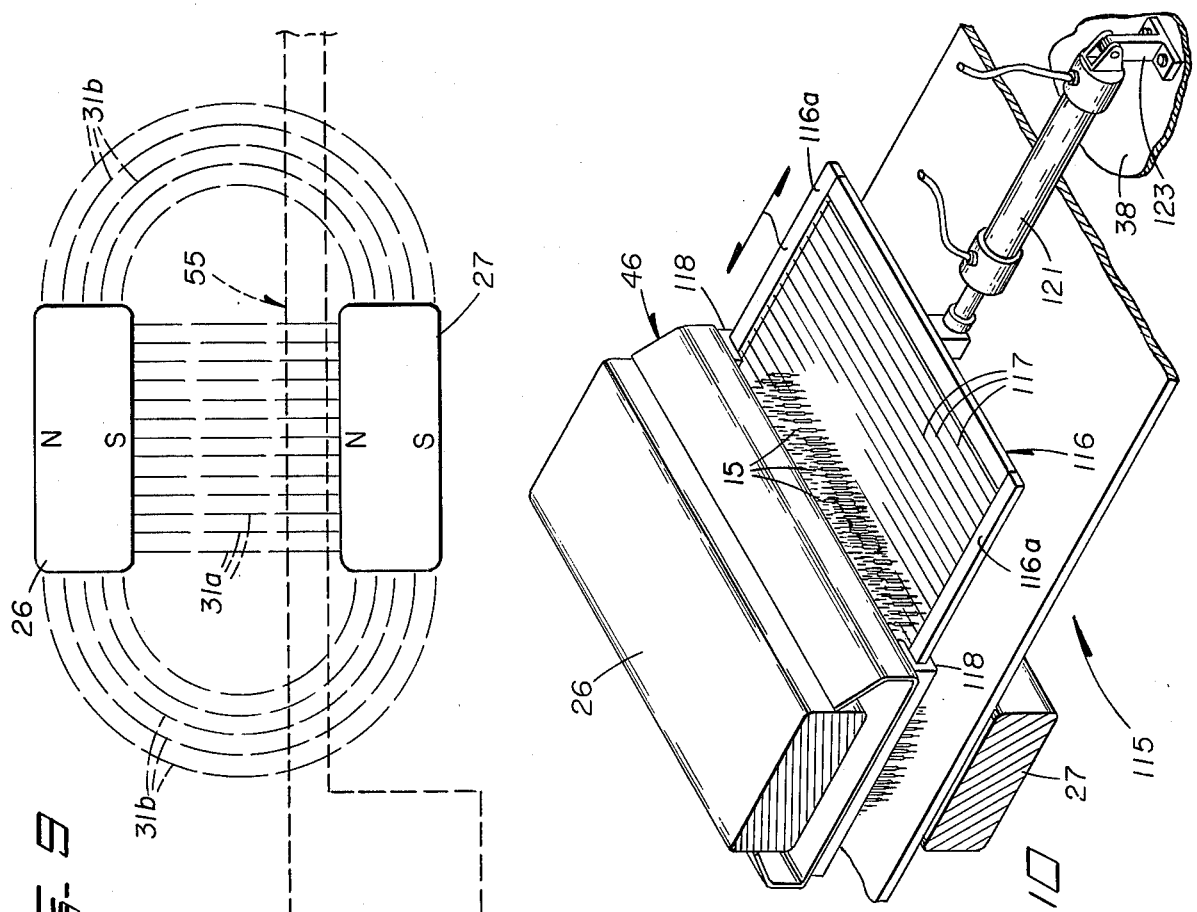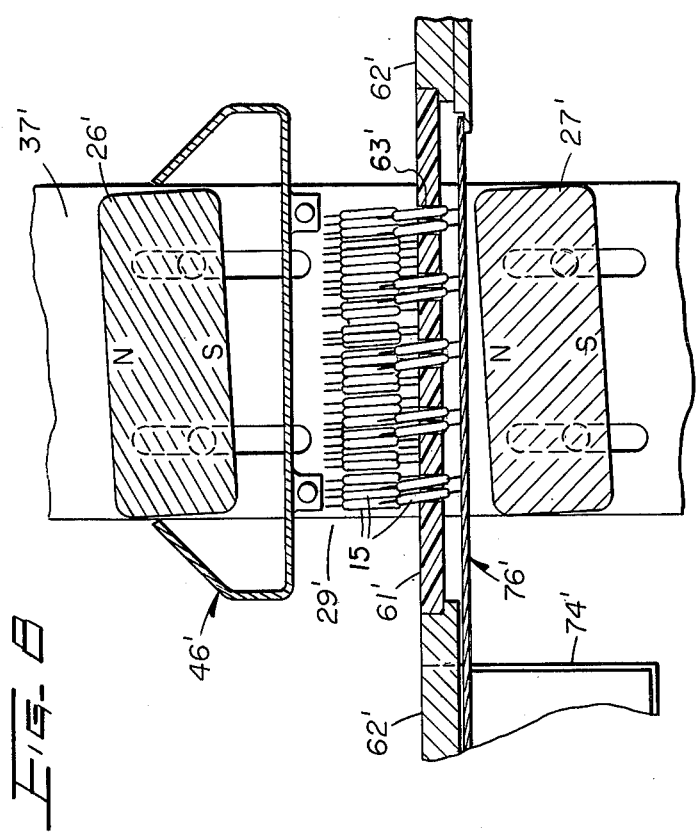

METHODS OF AND APPARATUS FOR HANDLING ARRAYS OF PARAMAGNETIC ARTICLES

BACKGROUND OF THE INVENTION

1. Field of the Invention

This invention relates to the handling and assembling of paramagnetic articles and, more particularly, to methods of and apparatus for successively loading a predetermined number of elongated paramagnetic articles out of a temporarily stored mass thereof, into a precisely spaced array for subsequent transfer to and unloading at a remote receiving station.

2. Description of the Prior Art

In the manufacture of electronic equipment, and particularly the type incorporating leaded articles, such as components and devices, it is often very desirous to provide a way of temporarily storing a mass of such articles in a manner that facilitates their removal either singly or in groups. With respect to handling groups of such articles, it is also very advantageous to provide automated means for the successive loading, transporting and unloading thereof in precisely defined arrays. Such handling operations, of course, are particularly important, for example, when common work functions are to be performed simultaneously on precisely positioned and properly oriented articles prior to their assembly in associated equipment, as well as during the assembly of the articles within precisely located receiving areas of the equipment.

By way of example, in the assembly of one particular type of remreed switch utilized in the telephone communications industry, there are 256 sealed contact switches of the leaded dry reed type, hereinafter generally referred to as sealed contacts, that must be inserted, in pairs, within each of an array of 128 vertically oriented coil forms which are supported at their lower ends to a shunt plate of the remreed switch. Heretofore, the sealed contacts have been inserted by hand, generally in pairs, within each of the coil forms. It is appreciated that when such switches are manufactured at a rate of thousands per day, and with 256 sealed contacts per switch, considerable operator assembly time has been involved in the prior manufacture of such switches, which assembly time has constituted an appreciable part of the total assembly costs of the switch.

With respect to elongated, paramagnetic articles in general, it has been common practice heretofore to utilize socalled magnetic storage bins (or containers) to temporarily store a mass of such articles in parallel relationship. In such storage bins the articles acquire axial orientations along the lines of force of a uniform magnetic field established between two mutually disposed magnetic sidewalls of the bin. Such parallel alignment not only facilitates article removal manually, or by automated apparatus, but in the case of leaded articles, prevents the leads thereof from becoming entangled in a "haystack" fashion while stored in mass. When the leads are of a type and size that are easily bent, the prevention of lead entanglement is very important if lead distortion is to be minimized.

It has also been appreciated heretofore that a properly established magnetic field, when associated with suitable fixturing, may be employed not only to temporarily store a mass of elongated paramagnetic articles in parallel relationship, but to facilitate the loading of such articles into respective ones of an array of apertures formed in a suitable loading fixture, or workholder, for subsequent transfer, generally manually, to a remote unloading station. At the latter station, the fixture is typically inverted so as to effect the unloading of the articles, by gravity, into respectively aligned receiving areas of an associated workpiece.

One approach taken heretofore to effect such a sequence of operating steps is disclosed in M. N. Reppert U.S. Pat. No. 3,574,919, assigned to the same assignee as the present invention. That patent is particularly concerned with a method and apparatus for loading an array of headed paramagnetic articles (leads) within respective apertures of a shuttle plate assembly, with the latter thereafter being transported manually to another work station whereat the loaded assembly is inverted so as to allow washers to be respectively assembled on the articles. Thereafter, the articles are released such that the shank portions thereof drop downwardly through aligned apertures of an associated wafer to be assembled therewith.

Such apparatus, however, does not incorporate any common mechanism that allows for the simultaneous loading, transfering and unloading of articles, whether headed or not, in a completely automated manner, and with no article inversion being required for the unloading thereof. Apparatus of the latter type would be of particular importance in the handling and assembly of articles such as the aforementioned sealed contacts, which are not only fragile, but have axially disposed, non-headed lead ends.

In H. A. Griesemer et al U.S. Pat. No. 3,386,156, also assigned to the same assignee as the present invention, a method and apparatus is disclosed for magnetically aligning and suspending a mass of paramagnetic articles, of either the headed or unheaded type, between two mutually disposed magnetic sidewalls of a storage bin, with one end of the articles initially being drawn against one surface of a non-magnetic plate interposed between the articles and one magnetic sidewall of the bin. Thereafter, an apertured workholder is manually inserted between the other surface of the plate and the adjacent magnetic sidewall, with the plate then removed and the workholder displaced back and forth transversely of the articles so as to magnetically draw the articles into different apertures of the workholder. Thereafter, the workholder is manually withdrawn from the storage bin, and subsequently transferred by hand to an unloading station. At that station, the loaded array of articles can only be released from the workholder either by inverting the latter, in the case where the articles are of the headed type, or alternatively, by physically removing a stop plate positioned below the apertured workholder, when the articles are of the non-headed (or symmetrical ended) type.

From the foregoing, it is seen that Griesemer et al's paramagnetic article handling apparatus necessarily involves a number of manual workholder manipulating steps in order to initially load the articles within the respective apertures thereof. In addition, neither Griesemer et al nor Reppert utilize a common mechanism for the loading, transfering and unloading of successive arrays of paramagnetic articles, nor interrelated apparatus of any type to carry out such functions in a completely automated manner.

SUMMARY OF THE INVENTION

It, therefore, is an object of the present invention to provide a simplified, inexpensive and reliable method and apparatus adapted for the high volume, automated handling and/or assembling of elongated paramagnetic articles initially stored in mass, wherein a predetermined number of such articles out of the mass thereof are initially loaded into successive, precisely spaced, arrays, with each array then transferred to an unloading station whereat the articles are released for assembly into an array of respectively aligned receiving areas of an associated workpiece positioned therebeneath, and wherein all of such operations are accomplished with a common mechanism that requires no inversion of the loaded array of articles, or an externally controlled magnetic field, to effect the unloading thereof.

In accordance with the principles of the present invention, the above and other objects are realized in a first preferred method and embodiment, particularly adapted to load, transfer and unload successive arrays of elongated paramagnetic articles, wherein a reciprocally movable transfer plate assembly is interposed between two mutually disposed bar magnets. The transfer plate assembly includes an elongated, nonmagnetic transfer plate, with a first portion thereof having a smooth planar upper surface, and a second portion thereof having an array of bores either formed therein, or preferably formed within a grid insert seated within the second portion.

The first and second portions of the transfer plate are arranged in tandem in the direction of retractable movement of the transfer plate. The latter is positioned within the magnetic field such that initially only the first portion thereof has one axial end of each of a temporarily stored mass of elongated paramagnetic articles magnetically drawn thereagainst, with the articles being oriented in parallel relationship along the lines of magnetic force of the established magnetic field. Upon the second portion of the transfer plate being advanced into the magnetic field, random ones of the articles, which remain confined within the field, are magnetically attracted to and "captured" within different ones of the article-receiving bores formed therein (or in a grid insert thereof).

After the captured array of articles have been withdrawn from the magnetic field by the transfer plate, a stop plate positioned adjacent the underside of the former, and having a corresponding, but normally offset array of apertures formed therein, is displaced relative to the transfer plate such that the captured articles simultaneously fall, by gravity, into respectively aligned receiving areas of an associated workpiece previously positioned beneath the stop plate.

For reasons discussed in greater detail hereinbelow, and particularly in connection with the loading, transfering and unloading of leaded paramagnetic articles of the sealed contact switch type, the bores formed in the transfer plate (or grid insert thereof) are slightly chamfered at their upper ends, and either the bores are formed at a slight angle, such as 1°-5° relative to a reference axis that is perpendicular to the upper surface of the transfer plate, or the magnetic field is tilted at such an angle. The chamfered bore ends facilitate the insertion of respective ones of the mass of temporarily stored contacts within different ones of the array of bores formed in the transfer plate. As for the inclined bores, or inclined magnetic field, either results in upper and lower sidewall regions of the bores more effectively frictionally engaging the captured sealed contacts, particularly as they are being withdrawn from the uniform region (with parallel lines of force) of the established magnetic field, and while they necessarily pass through the fringe field.

More specifically, certain regions of the fringe field (with arcuate lines of force) through which the articles pass have been found to be oriented so as to cause at least some of the sealed contacts to be magnetically drawn out of their respective bores unless they are maintained in a skewed, frictional-sidewall-engaging position therewithin. It should be understood, of course, that for other types of elongated paramagnetic articles, neither inclined receiving bores nor an inclined magnetic field may be required.

In any case, as a result of using a common reciprocal transfer plate, with different portions thereof advantageously functioning selectively and simultaneously as parts of the storage, loading, workholding, transfering and unloading sub-assemblies of the composite apparatus, each successively loaded array of articles may advantageously be maintained in a given position, and orientation, not only during the transfer thereof to the unloading station, but during the unloading and/or assembly operation. As such, both the methods and apparatus embodied herein to carry out such unique operations are seen to be peculiarly and advantageously simplified, with the apparatus also being of inexpensive and reliable construction.

BRIEF DESCRIPTION OF THE DRAWINGS

FIG. 1 is a perspective view of a typical sealed contact dry reed switch which constitutes one particular type of elongated paramagnetic article with which the present methods and apparatus, as embodied herein, is specially adapted to handle on a high volume basis, and specifically in connection with the assembly of such sealed contacts as a structural part of a composite remreed switch.

FIG. 2 is an enlarged, perspective view of a preferred embodiment of the invention which is particularly adapted to load, transfer and unload paramagnetic articles, such as of the sealed contact type depicted in FIG. 1, in accordance with the principles of the present invention;

FIG. 3 is an enlarged side elevational view, partially in section, of the apparatus of FIG. 2;

FIGS. 4 and 5 are enlarged, fragmentary, detail sectional views, with FIG. 4 taken along the line 4—4 of FIG. 2, and showing the grid insert portion of the transfer plate assembly positioned within an established magnetic field, so as to effect the loading of different randomly positioned ones of a mass of illustrative sealed contacts within the receiving bores of the grid insert, with FIG. 5 showing the loaded sealed contacts after having been transferred laterally by the transfer plate assembly to an unloading position overlying an illustrative article-receiving remreed switch positioned therebeneath;

FIGS. 6 and 7 are enlarged, fragmentary, detail sectional views, with FIG. 6 taken along the line 6—6 of FIG. 5, and showing the stop plate in a position that prevents the unloading of an array of sealed contacts from the grid insert, with FIG. 7 showing the stop plate after having been laterally displaced sufficiently relative to the grid insert so as to allow the loaded array of sealed contacts to pass through the respectively aligned apertures thereof, in pairs, into the respectively aligned coil forms of an associated and illustrative remreed switch;

FIG. 8 is an enlarged, fragmentary detail sectional view of the same basic parts of the apparatus as depicted in FIG. 4, but distinguishes therefrom by showing, as a second preferred and alternative embodiment, the magnetic field tilted slightly from a vertical axis, rather than the bores formed in the grid insert, so as to accomplish the same desired effect, namely, to insure that the loaded articles remain in the bores of the grid insert as the latter is moved through the fringe magnetic field;

FIG. 9 is a schematic end view of the two magnets disposed on opposite sides of the transfer plate assembly as depicted in FIGS. 2–7, with the polarity of the magnets and the uniform and fringe field flux lines established therebetween being shown symbolically by dash lines, and FIG. 10 is a fragmentary perspective view, partially in section, of an optional mechanism adapted to facilitate the loading of certain types of paramagnetic articles by imparting periodic agitation to the upper ends of the articles when confined within the magnetic field at the loading station.

DETAILED DESCRIPTION

Background of Sealed Contact Switches and the Problems in the Handling Thereof It should be appreciated that while the invention is described in detail herein in connection with the assembly of one particular type of elongated paramagnetic article, namely, a leaded sealed contact switch of the dry reed type, the methods and apparatus embodied herein for that purpose also have equal utility in the loading, transporting and unloading of other diverse types of elongated paramagnetic articles whether of the headed or unheaded type.

With particular reference first to FIG. 1, there is shown a representative sealed switch 15 of the dry reed type, with which the present invention is particularly concerned from an illustrative sealed contact assembly standpoint. Such a sealed contact switch, generally referred to hereinafter as simply a sealed contact, comprises an upper reed 16 and a lower reed 17, each of which includes an associated external lead portion 16a or 17a, and an inner planar contact portion 16b or 17b, with the contact portions being sealed within a glass sleeve 18, and positioned in at least partial overlapping relationship. The sealed contacts are constructed such that the overlapping contact portions are either separated by a predetermined space in the absence of an applied magnetic field, so as to function as a normally open switch, or are constructed to be in a normally contacting relationship, so as to function as a normally closed switch in the absence of an applied magnetic field. For further details as to the general construction of such a sealed contact switch, the nature of the reed contact materials, and the manner in which they are actuated, reference is made to D. B. Kimball U.S. Pat. No. 3,763,449, assigned to the same assignee as the present invention.

As sealed contacts of the type described herein are generally quite small, with the glass sleeve, for example, typically having a length on the order of 1.5 inches, and a diameter of 0.120 inch, it is seen that the external leads thereof are necessarily of very small diameter, often measuring approximately 0.020 inch, corresponding to No. 24 gauge wire. As a result, the leads can very easily be bent or otherwise distorted during handling operations, such as involved in their manufacture, packaging and ultimate circuit assembly. Particularly is this true when sealed contacts, for example, are handled in large bulk quantities in high volume production applications, as such mass handling can readily compound the problems of lead entanglement (haystacking), and lead distortion, if not obviated in some way. Lead distortion, of course, normally results in a reduction in efficiency in many, if not all, operating functions performed on the sealed contacts prior to their final assembly, and particularly those operations that are mechanized. However, even when manual operating functions are involved, bent leads can seriously affect the loading of the sealed contacts into temporary storage racks or workholders employed in the transporting and unloading operations associated with a given assembly application.

It, therefore, was normally necessary prior to the use of magnetic storage bins and associated loading workholders or fixtures of the types described hereinabove, to utilize auxiliary lead straightening apparatus to improve the efficiency in assembling small leaded articles in associated electrical circuitry and/or equipment, such as sealed contacts in remreed switches. Even with the existance of magnetic storage bins and associated workholders, however, the actual assembly (insertion) of sealed contacts into the coil forms of remreed switches heretofore was accomplished manually, normally in pairs.

Automated Methods and Apparatus for Handling Sealed Contacts

In accordance with the principles of the present invention, and with particular reference now to FIGS. 2 and 3, an apparatus 20, of simplified, reliable and inexpensive construction, is designed to effect not only the mass insertion of sealed contacts 15 within an assembly that will ultimately comprise a remreed switch 21, of the type extensively utilized in the telephone industry, but to effect the loading, transfering and unloading of the sealed contacts in an automated manner utilizing a common transfer mechanism, and with no inversion of the articles being required to effect the unloading thereof.

With specific reference to one illustrative application, and as previously mentioned, the apparatus 20 is particularly adapted to effect the simultaneous loading, transfering and unloading of 256 sealed contacts 15 of the type depicted in FIG. 1, in pairs, into respective ones of 128 vertically oriented coil forms 23 of one particular type of remreed switch 21. The coil forms 23 are each formed with a plurality of mutually disposed fillet-like projections 23a which define an effective slot along a central outer wall region thereof. A shunt plate 24 is formed with an array of apertures through which the coil forms respectively extend, with the outer wall slots in the coil forms interlocking the shunt plate therewith.

As the remreed switch is of a well known and conventional type that has been used for many years in the communications industry, it is shown herein in only symbolic form, with no further detailed discussion of the structural elements of the switch being deemed necessary in order to fully understand the principles of the methods and apparatus of primary concern herein.

With particular reference still directed to FIGS. 2 and 3, the sealed contact loading, transfering and unloading apparatus 20 comprises an intermediate bar magnet 26 and a lower bar magnet 27, both best seen in FIG. 4, that are mutually disposed so as to define a temporary sealed contact storage and loading region 29 therebetween, wherein a substantially uniform magnetic field is established, as represented by the vertically oriented flux lines 31a depicted in FIG. 9. Such an article confining field is established, for example, by positioning the magnets so that the south magnetic pole face of the upper magnet 26 faces the north magnetic pole face of the lower magnet 27, or vice versa. The arcuate flux lines 31b in FIG. 9 represent the fringe fields established along the bar magnets on opposite sides thereof. A third bar magnet 32 is optionally disposed above the bar magnet 26, with the space therebetween defining an optional temporary sealed contact storage area 33. No sealed contact loading takes place in this latter magnetic field region. While bar (or plate) magnets are disclosed herein to establish the requisite magnetic fields, it is understood that electromagnets could similarly be utilized for this purpose, if desired. The main advantages in using permanent magnets in the present application relate to their attributes of being relatively compact for the flux densities required, easily mounted, and requiring no circuit connections thereto.

All three bar magnets are secured at their opposite ends to respectively adjacent ones of a pair of vertically disposed side support plates 36, 37. These support plates are secured at their lower ends to a support member 38 which, in turn, is secured to a base plate 41 of the apparatus. Each of the support plates 36, 37 has three pairs of elongated and vertically oriented slots 39 formed therein. Each pair of slots is dimensioned and located within each support plate so as to allow the elevation of each magnet to be adjusted. With the ends of each magnet having a pair of fastening members 43 threaded within bores thereof, for example, the elongated slots 39 and the associated fastening members thus allow the spacing between each pair of mutually disposed bar magnets to be adjusted so as to establish a field region, with the desired dimensions and magnetic characteristics, applicable for any given type of paramagnetic articles to be temporarily stored therewithin. Non-magnetic spacer blocks 44 are preferably secured to the inner sidewalls of the side support plates 36, 37, so as to prevent any temporarily stored sealed contacts from gravitating to the extreme end regions of either adjacent pair of bar magnets.

A shield 46 has a base portion 46a that is positioned adjacent the bottom (south) pole face of the magnet 26, with two bent back sidewalls 46b terminating adjacent the respective sides of the magnet. In the illustrative embodiment, the shield is made of a non-magnetic material, such as polished aluminum. The shield 46 may be secured to the vertical support plates 36, 37 by any suitable means, such as by brackets 48, as depicted in FIG. 4.

With respect to better understanding the beneficial effect of a uniform magnetic field as an article storage medium, it will be recalled from the fundamental laws of magnetism that a force is exerted along the length of a paramagnetic article that tends to move the article to a position of maximum attainable flux density. The force from a sufficiently strong and uniform field will maintain such an article in a seemingly floating position within such a field, with at least the generally defined longitudinal axis of the article being aligned with the magnetic lines of force, and with at least one axially disposed end of the article being suspended from either one magnetized member, which in part defines the field, or suspended against a non-magnetic member positioned adjacent a magnetized member. When the articles have reasonable axial symmetry, which is the case with the above-described sealed contacts, all of the articles will be oriented into rather precise parallel axial relationship, by reason of seeking alignment with the uniformly established parallel lines of magnetic force and, as a result, will be quite stable in such an aligned relationship. Once in the field, of course, the articles become magnetized, and in the case of sealed contacts that are of the normally open type, they are actually actuated into a closed switching state, thus forming a continuous, axially disposed, conductive path for flux along the entire length of the leaded sealed contact.

With reference still to FIGS. 2 and 3, and in accordance with the principles of the present invention, a transfer plate assembly 55 is interposed between the bar magnets 26, 27. The transfer plate is mounted in a cantilevered fashion, by means of two spaced pairs of integral and apertured bosses 56, on a pair of guide rods 57 for lateral, reciprocal movement therealong. The apertures of the bosses 56 preferably have suitable bearings or bushings 58 secured therewithin so as to provide low friction movement of the transfer plate assembly 55. The guide rods 57 are supported at opposite ends by support members 59a, b (see FIG. 3) which are, in turn, secured to the support plate 38. As thus mounted, an end portion of the transfer plate assembly, including an apertured grid insert 61 seated therewithin, is adapted for reciprocal lateral movement into and out of the magnetic field established between the bar magnets 26 and 27.

Considering the transfer plate assembly 55 now in greater detail, it is comprised of a non-magnetic, low friction transfer plate 62 made, for example, out of Teflon ®, and having a rectangular opening formed in a central portion of one end section within which the aforementioned apertured grid insert 61 is removably nested in any suitable manner. As illustrated, the grid insert simply rests on peripheral, undercut shoulders 62a which define the central opening in the transfer plate (see FIGS. 4 and 5). The grid insert 61 is formed with an array of bores 63 that extend therethrough, with the bores being arranged in closely adjacent pairs in accordance with the illustrative application so that each pair coincides with a different coil form 23 of the rem-reed switch 21, as best seen in FIG. 7.

The primary advantage in forming the desired array of apertures in the grid insert 61 rather than in the transfer plate 62 itself is that the former is readily replaceable, and relatively inexpensive, whereas the latter is not as easily removed from the mechanism, and is naturally more expensive because of both the larger surface area and structural details associated with the underside thereof. For reasons discussed in greater detail in connection with the operation of the apparatus, the bores 63 that extend through the grid insert 61 are slightly chamfered at their upper ends and, as shown in the first illustrative embodiment depicted in FIGS. 2–7, are formed at an angle of approximately 2° relative to an imaginary vertical reference axis that is perpendicular to the upper surface of the grid insert 61. As will also be discussed later in greater detail in connection with a second illustrative embodiment of the invention, the magnetic field could be tilted rather than the bores to produce the same aforementioned desired effect, namely, insure that the contacts remain within the bores as the grid insert is moved laterally through the fringe field established along the common edges of the bar magnets.

A handle or knob 66, secured to one of a pair of side blocks 68, provides an accessible member which an operator can grip to move the transfer plate assembly 55 reciprocally along the guide rods 57 in the Y-direction, as indicated by the arrows 69. The length of the guide rods 57, and of the transfer plate 62, in the direction of lateral reciprocal movement of the latter, are chosen so that a planar portion 62b of the transfer plate, or the coplanar apertured grid insert 61, or a section of both, are positioned within the uniform magnetic field established between the bar magnets 26, 27 at all times. The side blocks 68, which are secured to and nested within notched-out corner regions of the transfer plate 62, are also employed to support a pair of transverse guide rods 71, 72 (see FIGS. 3–5).

In accordance with an aspect of the invention, the guide rods 71, 72 support a spaced pair of retractable blocks 74 which have longitudinally disposed bores through which the guide rods extend. The blocks 74 support one edge region of a stop plate 76. The opposite edge region of the stop plate rides along an undercut shoulder 79 (see FIGS. 3 and 5) formed in an auxiliary support plate 81. The latter is secured to the underside of the transfer plate 62 in the non-apertured end region thereof. As depicted in FIG. 2, an extension of the guide rod 71, for example, has a handle or knob 83 secured thereto so as to effect reciprocal cross-slide movement of the stop plate 76 in the X-direction, as indicated by the arrow 86. This direction, of course, is perpendicular to the reciprocal movement of the transfer plate 62.

The stop plate 76, as best seen in FIGS. 6 and 7, is formed with an array of apertures 89 which may either be arranged in adjacent pairs, as are the bores 63 formed in the grid insert 61, or simply comprise single apertures, each of which is dimensioned to be co-extensive with a different pair of grid insert bores, as illustrated in FIG. 7. The stop plate is normally positioned so that the array of apertures therein are displaced, or off-set, from the respectively associated pairs of bores formed in the grid insert, as best seen in FIG. 6. When the transfer plate is in its off-set position, it functions to prevent any of the sealed contacts 15, previously loaded in the respective bores of the transfer plate grid insert 61, to be unintentionally released therefrom. However, when the stop plate 76 is moved laterally a predetermined distance in the X-direction, by an operator grasping and displacing the associated knob 83, the apertures 89 in the stop plate will then be brought into registry with the respectively associated pairs of bores 63 in the grid insert 61. As a result, all of the loaded sealed contacts 15 will then simultaneously fall in pairs, by gravity, into the respectively associated and aligned coil forms 23 of a remreed switch 21 previously positioned therebeneath.

From the foregoing, it is seen that the transfer plate assembly 55 advantageously functions, with commonality, not only to effect the loading, transporting and unloading of successive arrays of sealed contacts 15, but to accomplish these functions in a manner that requires no physical inversion of the loaded arrays of contacts, nor the need for any auxiliary fixturing, or externally established magnetic fields.

In order to further insure the reliable unloading of the sealed contacts 15 into the respective coil forms 23 of the remreed switch 21, the latter is preferably mounted on a vertically reciprocal support nest assembly 95. As best seen in FIGS. 2 and 3, this assembly comprises a remreed switch-receiving nest 96, which includes a base 97, two guide members 98 disposed along opposite edges of the base, and a stop member 99 positioned along one edge of the base defined between the two guide members. All of these members may either be formed as an integral part of, or otherwise secured to the base 97, to form the composite nest. With the stop member 99 positioned on the right side of the nest, as viewed in FIG. 2, each successive remreed switch 21 is most readily mounted on the nest 96 by being inserted thereon from the left side of the apparatus 20.

As best seen in FIG. 3, in order to facilitate not only the mounting and removal of each remreed switch from the supporting nest 96, but its ultimate positioning immediately adjacent the underside of the stop plate 76 during each unloading operation, the underside of the base 97 of the nest is secured to an L-shaped bracket 102 which, in turn, has one edge portion adapted to be keyway guided within a guide member 103. The latter is secured to an L-shaped bracket 104 which, in turn, is secured at its upper end to the underside of an extension 38a of the support plate 38 (see FIG. 3). The upper end of an adjustable linkage 105 is pivotally coupled to the lower end of the bracket 102, with the lower end of the linkage being pivotally coupled to one end of an arm 106 (see FIGS. 2 and 3). The opposite end of the arm 106 is pivotally coupled to a lever 107. An intermediate section of the arm 106 is also pivotally coupled to the L-shaped bracket 104. The upper end of the lever 107 is pivotally coupled to a bell crank 108 which, in turn, is rotatably mounted on a stub shaft 109 secured to the vertical support plate 36. The upper end of the bell crank 108 has a section of reduced cross-sectional area that forms a handle 108a.

With the remreed nest assembly 95 thus constructed, it is seen that by moving the handle portion 108a of the bell crank in a counterclockwise direction from its vertical position, the nest 96 is raised to its uppermost adjustable elevation, as shown in phantom, whereas movement of the lever portion 108a in the opposite direction causes the nest to move to its lowermost elevation. The limits of rotational movement of the bell crank 108 and, hence, vertical displacement of the nest 96, is preferably restricted in some suitable manner, such as by the selective adjustment of the various linkages, and by the use of either fixedly or adjustably positioned stops or detents. An adjustable stop 111 is shown in FIGS. 2 and 3 to limit counterclockwise movement of the bell crank 108 and, thereby, the uppermost elevation of the nest 96.

It, of course, is appreciated that the remreed switch-receiving nest assembly 95 could be mounted on a cross-slide mechanism utilizing guide rods similar to those for the transfer plate assembly 55, or the stop plate 76. In connection with the operation of any of the reciprocally mounted assemblies, it is understood that they could be selectively controlled in a sequential manner by program-controlled power sources, such as either motors or pneumatic cylinders operated in response to a microcomputer, for example.

Operation of Sealed Contact Assembly Apparatus

In accordance with the principles of the present invention, the assembly apparatus 20 operates in the following manner in connection with the loading, transporting and unloading of successive arrays of sealed contacts 15: At the inception of a given assembly operation, a large number of sealed contacts 15 are initially positioned manually between the upper surface of the transfer plate 62 and the mutually disposed base portion 46a of the shield 46 (as best seen in FIG. 4), with such sealed contacts normally being periodically taken from the temporary storage area 33 defined between the bar magnets 26 and 32. Alternatively, such sealed contacts may be continuously fed to the storage area 29 in an automated manner, such as by the use of a vibratory bowl and an associated feed shute, or through the use of an article advancing feed wheel associated with an auxiliary magnetic storage bin, as disclosed in J. E. Beroset U.S. Pat. No. 3,537,580, assigned to the same assignee as the present invention.

In any event, with a mass of sealed contacts 15 stored in the region 29 between the magnets 26 and 27, the transfer plate 62 is displaced laterally such that the apertured grid insert 61 mounted therein is moved into the magnetic field in question. During such movement, the stored mass of sealed contacts 15 tend to tilt slightly from their previous, vertically oriented positions, as a result of the lower lead ends thereof attempting to advance slightly in the direction of the transfer plate, namely, from left-to-right, as viewed in FIGS. 3 and 4. There is very little actual lateral displacement of the sealed contacts, if any, however, because of both the low friction material employed for the transfer plate 62, such as Teflon®, and the opposing magnetic forces inherently established between immediately adjacent contacts of the mass thereof by reason of the uniform magnetic field established between the bar magnets 26, 27.

As a result of the sliding, low friction contact made between the lower ends of the mass of sealed contacts and the transfer plate 62, certain ones of the contacts necessarily become aligned with, and are magnetically drawn within different ones of the grid insert bores 63. The resulting "captured" sealed contacts are thereafter maintained within the respectively associated grid insert bores as a result of the greater magnetic attractive force imparted thereagainst by the more closely spaced lower bar magnet 27.

Considered more specifically, the elevation of the transfer plate 62 is chosen such that the spacing "Z" between the upper surface thereof and the adjacent surface of the lower magnet 27, as depicted in FIG. 4, is shorter than the spacing between the non-magnetic base portion 46a of the shield 46 and the adjacent surface of the upper magnet 26 denoted by the letter Z'. It should also be noted that the space between the upper surface of the transfer plate 62 and the mutually disposed base portion 46a of the shield 46, denoted by Z", which defines the temporary sealed contact storage and loading region 29, is also chosen such that there is a very small clearance (approximately 1/16 inch) to accommodate each of a batch of sealed contacts 15 which are bulk supplied periodically by hand (or continuously in an automated manner) within the region 29 of the apparatus.

With the apparatus 20 so constructed, and with the specified structural elements thereof so spaced relative to each other, it is seen that the sealed contacts 15, prior to being seated within the bores 63, are normally maintained in the above-described illustrative embodiment in a substantially vertical position within the magnetic field, i.e., perpendicular to the transfer plate 62. Equally important is the fact that their lower lead ends are always magnetically attracted against the transfer plate 62 (or the grid insert 61 coplanar therewith), as a result of the lower lead ends being closer to the bar magnet 27 than are the upper lead ends with respect to the magnet 26. This is true even if the upper lead ends of the sealed contacts are initially brought into contact with the base 46a of the shield during the periodic bulk storing thereof.

After the withdrawal of the apertured grid insert 61 from the magnetic field, with 256 sealed contacts, for example, nested within the respective apertures thereof, a remreed switch 21 is positioned on the supporting nest 96 and thereafter raised vertically to a position immediately adjacent the underside of the stop plate 76. At that time, the apertured stop plate 76, positioned immediately adjacent the the underside of the grid insert, is displaced relative to the latter so as to bring the array of grid insert bores 63 into registry with the array of stop plate apertures 89 (see FIG. 7). When this happens, all of the captured sealed contacts 15 fall, by gravity, in closely adjacent pairs, into the respectively aligned and vertically oriented coil forms 23 of the remreed switch 21. It is important to note that it is the vertically retractable support nest assembly 95 that makes it possible for the upper ends of the coil forms 23, in particular, to be positioned immediately adjacent the underside of the apertured stop plate 76 and, thereby, effectively result in essentially continuous guide channels being formed which further insure reliable gravity-feed transfer of the sealed contacts into the coil forms 23. Upon completion of the described assembly operation, the nested remreed switch 21 is lowered and removed from the nest 96, with the transfer plate assembly advanced so as to again position the grid insert 61 thereof within the magnetic field region 29 to commence a new sealed contact loading operation.

In accordance with the operation of the illustrative apparatus 20, it is seen that a remreed switch 21 is positioned on the support nest 96 only after the grid insert 61, with a loaded array of sealed contacts, has been transferred from the loading station 29, defined between the magnets 26, 27, to the unloading station which is located directly above the remreed switch support nest 96. It should be readily apparent, however, that either the degree of vertical displacement of the nest 96, or the length of the transfer plate assembly, together with the length of travel thereof in one direction, could be selectively chosen so as to allow each successive remreed switch (or any other workpiece) to be placed on the support nest 96 at any time during each successive assembly operation, without in any way interferring with the lateral reciprocal displacement of the transfer plate assembly.

FIG. 8 illustrates a second preferred and alternative embodiment of the invention, and is a sectional view of the same basic parts of the apparatus 20 as depicted in FIG. 4, but distinguishing therefrom by showing the magnetic field established between the bar magnets 26', 27', rather than the bores 63' of the grid insert 61', being tilted slightly relative to a vertical reference axis. As the structural elements in all other respects are the same in FIGS. 4 and 8, those in FIG. 8 are identified with like, but primed reference numerals.

With the magnetic field slightly inclined, such as on the order of 1°-5° relative to a vertical reference axis, the axes of the sealed contacts 15 temporarily stored therewithin will each tend to acquire the same angle of inclination. More importantly, however, is the fact that such an inclined field will result in the sealed contacts that subsequently are magnetically drawn into the respectively associated bores 63' remaining therein while the grid insert 61' is passed through the fringe magnetic field. As such, the inclined magnetic field serves the same function as the similarly inclined bores 63 formed in the grid insert 61 depicted in FIGS. 4 and 5 of the first embodiment.

Considered more specifically, with the magnetic flux lines being inclined from right to left in an upward direction, as depicted in FIG. 8, the nested or captured sealed contacts attempt to become axially aligned with the flux lines, thus acquiring slightly skewed or inclined positions within the respective bores 63'. As such, opposite end regions of the tubular portion of each sealed contact, because of magnetic forces imparted thereagainst, frictionally engage upper right and lower left sidewall regions of the associated bore, as viewed in FIG. 8. Such frictional contact remains at least until the grid insert 61' with a loaded array of sealed contacts 15 passes through the fringe field not only because of the presence of the inclined magnetic field, but because of the lower bar magnet 27' being closer to the nested sealed contacts than is the upper bar magnet 26'. The degree of inclination attainable by the sealed contacts within the bores will depend, of course, not only on the angular orientation of the field relative to a vertical reference axis, but on the size of the bores 63' relative to the diameter of the tubular portion of the sealed contacts.

It should also be noted that the shield 46' is not tilted as are the magnets in the illustrative embodiment depicted in FIG. 8. As the shield is of non-magnetic material, it is appreciated that its orientation has no effect on the angle of inclination of the magnetic field itself. However, it is desirable to have a uniform space between the upper surface of the grid insert 61' and the base 46a' of the shield, with the latter also properly adjusted in elevation, so as to insure that the mass of temporarily stored sealed contacts 15 can never be magnetically attracted against the base 46a' of the shield, rather than against the upper surface of either the transfer plate 62' or the grid insert 61', prior to selected contacts being magnetically drawn into respectively aligned bores 63'.

In practice, the use of a tilted magnetic field rather than tilted bores formed in the grid insert may be preferred when a number of grid inserts with different patterned arrays of bores may be required in connection with a number of related or different manufacturing and/or assembly operations. In such situations, and particularly when there are a large number of bores in a given patterned array, and/or critical spacings between bores, it may be advantageous to drill the bores through the grid insert with a vertical orientation. Such a drilling operation may be precisely performed, and in a completely automated manner, using conventional tape-controlled drilling apparatus, for example. An additional material advantage in utilizing a tilted magnetic field is that it is readily adjustable, with the angle of inclination being easily determined for any given article handling application.

Attention will now be directed to several possible modifications of, and/or additions to, the composite apparatus 20 as constructed in accordance with either the first (FIG. 2 plus FIGS. 3–7) or second (FIG. 2 plus FIG. 8) preferred embodiments described above. With reference first to the transfer plate 62 (or 62' of FIG. 8), it should be appreciated that it may be readily mounted on the guide rods 57 through the use of resilient bushings, such as of rubber, that would allow an optional ultrasonic vibrator or transducer of conventional design, such as shown in phantom and identified by the reference numeral 114 in FIG. 3, to be coupled thereto so as to impart vibratory motion to the transfer plate. This would normally not be desirable in handling sealed contacts, however, as the overlapping contact areas thereof are normally so smooth, that should appreciate sliding contact, such as effected by relatively high frequency vibration, take place after the contacts are closed under the influence of the magnetic field, the contacts could actually become cold-welded together.

In certain situations, however, vibratory movement of the transfer plate 62 could possibly facilitate the loading and/or unloading of certain types of paramagnetic articles, particularly when they are of asymmetrical configuration, or when they do not have a well defined longitudinal axis, or when they have outer surfaces that are not smooth. In the case of sealed contacts, of course, they advantageously do exhibit axial symmetry and have smooth outer surfaces.

Nevertheless, there may be situations when it would be desirable in the loading of certain types of elongated paramagnetic articles into the bores 63 (or 63') of the grid insert 61 (or 61'), to produce a limited degree of periodic article agitation beyond that which takes place by any shortstroke reciprocal movement of the transfer plate assembly 55, but at a frequency considerably lower than that effected by ultrasonic vibration. To effect such periodic article agitation, a non-magnetic strand assembly 115 of the type depicted in FIG. 10, for example, could be readily employed. The strand assembly comprises a non-magnetic forked frame 116, and preferably a plurality of non-magnetic small diameter strands 117, such as of plastic, which are secured at opposite ends to and extend in parallel relationship between two mutually disposed side members 116a of the forked frame. The side members 116a are shown supported within, and guided along, respective grooves formed in associated guide rails 118. The latter are secured in any suitable manner to the base 46a of the shield.

Periodic, retractable movement of the strand assembly 115 may be effected by any suitable means, such as a double-acting pneumatic cylinder 121 secured at one end, for example, through a bracket 123 to a rearward surface region of the support member 38, such a region being best seen in FIG. 3.

The strand assembly 115 is preferably mounted within the magnetic field such that the strands 117 thereof come in contact with only terminating regions of the upper leads of the sealed contacts. As such, relatively slow reciprocal movement of the strand assembly 115 will cause the strands to gently brush across the upper lead ends of different groupings of the sealed contacts, with the result that the latter will be periodically and selectively tilted, or agitated. Such strand-imparted agitation of the sealed contacts, when properly controlled, can facilitate their being magnetically drawn into respectively aligned bores of the grid insert whether any short-stroke reciprocal movement of the transfer plate assembly 55 is also employed for that purpose or not, and regardless whether either the bores or magnetic field, or neither, is tilted from a vertical reference axis. With the strand assembly 115 being reciprocally mounted so as to extend into the magnetic field from the back side of the apparatus 20, the frame-supported strands 117 may be readily retracted from between the magnets during the periodic bulk loading of sealed contacts therebetween, if desired.

In summary, several unique methods and apparatus have been disclosed for successively loading a predetermined number of elongated paramagnetic articles out of a temporarily stored mass thereof, initially confined within a magnetic field, into a precisely spaced array for subsequent transfer to and unloading at a remote station. As a common reciprocal mechanism is employed to carry out all of these functions, and with no inversion of the articles being required to effect the unloading thereof, the composite apparatus advantageously is also of simplified, inexpensive and reliable construction.

It is obvious that various modifications may be made to the illustrative methods and embodiments of the present invention, and that a number of alternatives, in addition to those described above, may be provided without departing from the spirit and scope of the present invention.

For example, a selectively magnetized plate (not shown), preferably mounted for vertical reciprocal displacement, could be employed as an alternative to, or cooperate with, the apertured stop plate in controlling the release of an array of articles at the unloading station. More specifically, such a selectively magnetized plate could be utilized to withdraw an array of headed articles, for example, from the respective bores of the grid insert, with the latter then displaced so as to position a suitably dimensioned cutout area (not shown) formed in the transfer plate in alignment with the magnetically held array of articles. The articles could thereafter be controllably released from the magnetized holding plate, while the latter is either at its raised or at a lower elevation, so as to pass through the cut-out area (or areas) of the transfer plate, and the then aligned apertures in the stop plate, if employed, and be received within respectively aligned receiving areas of an associated workpiece positioned therebelow. With respect to materials, it should be apparent that while both the shield 46 and stop plate are disclosed as being made out of non-magnetic metallic material, such as aluminum, or other similar materials such as brass or stainless steel, they also could be made out of non-metallic material that is similarly non-magnetic and field transparent, such as a suitable plastic, as is preferred for the transfer plate and associated grid insert in the illustrative embodiments.

What is claimed is:

1. A method of successively loading a predetermined number of elongated paramagnetic articles out of a mass thereof, wherein the articles of the mass are initially stored in parallel relationship within a magnetic field, into precisely spaced arrays for subsequent transfer to an unloading station, whereat each array of articles is unloaded into an aligned array of receiving areas of an associated workpiece, comprising the steps of:

maintaining the mass of stored articles temporarily within said magnetic field such that said articles have one of their respective ends in contact initially with a smooth planar surface of a first non-magnetic but field transparent member portion positioned within and at least substantially perpendicular to the established lines of magnetic force;

advancing said first planar member portion beyond the influence of said magnetic field such that a second non-magnetic but field transparent member portion is positioned within said field, said last mentioned portion constituting at least an associated coplanar extension of said first member portion, and being formed with a predetermined array of article-receiving and selectively-confining bores, the advancement of said second member portion within said magnetic field causing different ones of said stored mass of articles to be magnetically attracted to and initially confined at a predetermined depth within said respective bores;

withdrawing said second member portion with an array of articles confined within the bores thereof from within said magnetic field, and transferring said array of articles to the unloading station, while simultaneously advancing the planar surface of said first member portion back into said magnetic field so as to again be in contact with the remaining mass of stored articles, and actuably releasing said confined articles within said respective bores at said unloading station so as to allow them to fall, at least in part by gravity, into respectively aligned article-receiving areas of an associated workpiece positioned therebeneath.

2. A method in accordance with claim 1 wherein said magnetic field is established between a pair of mutually disposed upper and lower permanent magnets.

3. A method in accordance with claim 2 wherein said second member portion includes a replaceable non-magnetic insert with said array of bores formed therein, and being seated within an accommodating opening formed in said second member portion, and wherein said insert bores are made selectively article-confining by releasably closing the lower ends thereof, with said array of loaded articles being released from said bores only after being properly positioned at said unloading station.

4. A method in accordance with claim 1 wherein said bores are each formed in said second member portion at a predetermined angle of inclination, relative to an imaginary axis that is perpendicular to the planar article contacting surface areas of said second member portion, such that said bores are oriented downwardly, and in the direction of initial advancement of said second member portion into said magnetic field, preparatory to the step of receiving articles respectively therewithin.

5. A method in accordance with claim 3 wherein said bores are each formed in said insert at a predetermined angle of inclination, relative to an imaginary axis that is perpendicular to the planar article contacting surface areas of said insert, such that said bores are oriented downwardly and in the direction of initial advancement of said insert into said magnetic field preparatory to the step of receiving articles respectively therewithin.

6. A method in accordance with claim 1 wherein said magnetic field is oriented at a predetermined angle relative to an imaginary axis that is perpendicular to the planar surface areas of said first and second member portions, and with the angle of inclination of the flux lines being viewed as directed downwardly and in the direction of movement of said second member portion as they pass therethrough.

7. A method in accordance with claim 3 wherein said first and second member portions are mounted for reciprocal lateral movement into and out of said magnetic field.

8. A method in accordance with claim 7 wherein a workpiece when positioned outside said magnetic field at the loading station is mounted for selective displacement at least vertically into close proximity with the underside of insert, thereby, facilitating the reliable transfer of said bore-confined articles into the respectively aligned receiving areas of the workpiece.

9. A method in accordance with claim 2 wherein said first and second member portions are located at an elevation between said permanent magnets such that the mass of stored articles are only magnetically attracted, at one end thereof, against upper surface areas of said first and second member portions as they are selectively positioned within said magnetic field.

10. A method in accordance with claim 3 wherein said magnetic field is oriented at a predetermined angle relative to an imaginary axis that is perpendicular to the planar surface areas of said first and second member portions, and with the angle of inclination of the flux lines being viewed as directed downwardly and in the direction of movement of said second member portion as they pass therethrough, and wherein said first and second member portions are mounted for reciprocal lateral movement into and out of said magnetic field.

11. A method in accordance with claim 8 wherein said magnetic field is oriented at a predetermined angle relative to an imaginary axis that is perpendicular to the planar surface areas of said first and second member portions, and with the angle of inclination of the flux lines being viewed as directed downwardly and in the direction of movement of said second member portion as they pass therethrough.

12. A method in accordance with claim 8 wherein said bores are each formed in said insert at a predetermined angle of inclination, relative to an imaginary axis that is perpendicular to the planar article contacting surface areas of said insert, such that said bores are oriented downwardly and in the direction of initial advancement of said insert into said magnetic field preparatory to the step of receiving articles respectively therewithin.

13. A method in accordance with claim 9 wherein the mass of stored articles are further confined within the magnetic field by positioning a non-magnetic shield between the upper ends of the articles and the adjacent pole face of the upper magnet, with the distance between said shield and the adjacent pole face of the upper magnet being greater than the distance between the upper planar surface areas of the first and second member portions and the adjacent pole face of the lower magnet, and wherein the mutually disposed pole faces of the magnets are of opposite polarity.

14. A method in accordance with claim 13 wherein the step of moving said second member portion into and out of said magnetic field further includes the step of moving the second member portion back and forth at least once while in said magnetic field so as to facilitate the magnetic attraction of certain ones of said stored mass of articles respectively into different ones of the receiving bores.

15. A method in accordance with claim 13 further comprising the step of:
vibrating at least said second member portion so as to facilitate the magnetic attraction of certain ones of said stored mass of articles respectively into different ones of the receiving bores of said second member portion.

16. A method in accordance with claim 13 further comprising the step of:
positioning at least one non-magnetic strand at an elevation near the upper ends of the mass of stored articles while confined within said magnetic field, and reciprocally moving said strand along a horizontal plane so as to periodically brush against upper end regions of, and slightly tilt, the articles that come in contact therewith alternately in opposite directions so as to facilitate the magnetic attraction of certain ones of said stored mass of articles respectively into different ones of the receiving bores of said second member portion.

17. A method in accordance with claim 13 further comprising the steps of:
periodically bulk supplying with articles an auxiliary magnetic field-defined storage area positioned closely adjacent said storage area defined between said pair of magnets, and
periodically transferring articles from said auxiliary storage area to the storage area defined between said pair of magnets so as to replenish the successive arrays of loaded articles removed therefrom.

18. A method of successively loading a predetermined number of elongated paramagnetic articles, initially stored in parallel relationship, within a magnetic field, into precisely spaced arrays for subsequent automated transfer to an unloading station, whereat each array of articles is unloaded into an aligned array of receiving areas of an associated workpiece, comprising the steps of:
establishing a magnetic field between a pair of permanent magnets, with the mutually opposed pole faces of said magnets being of opposite polarity and defining an article storage area therebetween;
maintaining the mass of stored articles temporarily within said magnetic field such that said articles have one of their respective ends in contact initially with a smooth planar surface of a first non-magnetic member portion positioned within and at least substantially perpendicular to said magnetic lines of force;
advancing said first planar member portion beyond the influence of said magnetic field such that a second non-magnetic member portion is positioned within said field, said last mentioned portion constituting at least an associated coplanar extension of said first member portion, and being formed with a predetermined array of article-receiving bores extending therethrough, the advancement of said second member portion within said magnetic field causing different ones of said stored mass of articles to be magnetically attracted to and initially confined at a predetermined depth within said respective bores;
selectively confining the articles at said predetermined depth within said bores by releasably closing the lower ends of the latter, with said array of loaded articles being released from said bores only after being properly positioned at said unloading station, and
withdrawing said second member portion with an array of articles confined within the bores thereof from within said magnetic field, and transferring said array of articles to the unloading station, while simultaneously advancing the planar surface of said first member portion back into said magnetic field so as to again be in contact with the remaining mass of stored articles, and
actuably opening the lower ends of said bores and releasing said confined articles therewithin at said unloading station so as to allow said articles to fall, at least in part by gravity, into respectively aligned article-receiving areas of an associated workpiece positioned therebeneath.

19. A method in accordance with claim 18 wherein said second member portion includes a replaceable non-magnetic insert with said array of bores formed therein, and being seated within an accommodating opening formed in said second member portion;
wherein said first and second member portions are mounted for reciprocal lateral movement into and out of said magnetic field, and
wherein a workpiece when positioned outside said magnetic field at the loading station is mounted for selective displacement at least vertically into close proximity with the underside of at least said insert, thereby, facilitating the reliable and precise transfer of said bore-confined articles into respectively aligned receiving areas of the workpiece.

20. A method in accordance with claim 19 further comprising the steps of:
periodically bulk supplying with articles an auxiliary magnetic field-defined storage area positioned closely adjacent said storage area defined between said pair of magnets, and
periodically transferring articles from said auxiliary storage area to the storage area defined between said pair of magnets so as to replenish the successive arrays of loaded articles removed therefrom.

21. A method in accordance with claim 19 wherein a non-magnetic shield is positioned adjacent said upper magnet, and wherein said first and second member portions are located at an elevation between said magnets such that the mass of stored articles are restricted in movement along their axes within said magnetic field so as to be magnetically attracted at only one of their respective ends against selective upper surface areas of said first and second member portions, and associated insert, as they are selectively positioned within said magnetic field.

22. A method in accordance with claim 19 wherein said bores formed in said insert and said magnetic field established between said magnets are selectively oriented at a predetermined angle of inclination, relative to an imaginary axis that is perpendicular to the upper planar surface area of said insert such that the resulting angle of inclination is viewed as extending downwardly through said insert and in the direction of initial advancement thereof into said magnetic field preparatory to the step of receiving an array of articles within the bores thereof.

23. An apparatus particularly adapted to successively load a predetermined number of elongated paramagnetic articles out of a mass thereof into precisely spaced arrays, for subsequent transfer to an unloading station, whereat each array of articles is unloaded, such as into an aligned array of receiving areas of an associated workpiece, said apparatus comprising:
means for establishing a uniform magnetic field with predetermined width, length and height field boundaries within which the magnetic lines of force are parallel and of uniform field strength, the field within said boundaries defining in part a temporary magnetic storage area for a mass of paramagnetic articles, wherein the latter tend to axially align themselves with the established lines of magnetic force;
a reciprocally mounted assembly, including a substantially planar member made of a non-magnetic material, said member having first and second portions that are juxtaposed in the direction of movement of said assembly, with said second portion including a predetermined array of article-receiving bores, said member being positioned and mounted for travel within said magnetic field such that one end of each of a mass of stored articles will continuously be magnetically attracted against, and extend at least substantially perpendicularly upward from said member, and with said member being dimensioned such that upon the advancement of said first member portion from a position initially at least substantially within said magnetic field to a position beyond the influence of said field, said second member portion is moved completely into said field, causing different ones of a mass of stored articles to be magnetically attracted to and initially confined at a predetermined depth within said respective bores, with the subsequent withdrawal of said second member portion with an array of loaded articles from the influence of said magnetic field resulting in said articles being positioned at the unloading station, and
means for actuably releasing said bore-confined articles so as to allow them to fall, at least in part by gravity, such as into respectively aligned article receiving areas of an associated workpiece positioned therebeneath.

24. An apparatus in accordance with claim 23 wherein said magnetic field is established between a pair of upper and lower mutually disposed permanent magnets.

25. An apparatus in accordance with claim 24 wherein said second member portion includes a replaceable non-magnetic insert having said array of bores formed therein and extending therethrough, said insert being seated within an accommodating opening formed in said second member portion, and wherein said means for actuably releasing bore-confined articles comprises reciprocally mounted stop plate means positioned immediately adjacent the underside of said insert and carried by said reciprocally mounted assembly, said stop plate being adapted for movement transversely of the reciprocal movement of said insert, and being formed with an array of apertures corresponding at least spatially with, but normally offset with respect to said array of bores, an array of loaded articles thereby being released from said bores by displacing said stop plate means to position the apertures thereof in registry with said bores.

26. An apparatus in accordance with claim 23 wherein said bores are each formed in said second member portion at a predetermined angle of inclination, relative to an imaginary axis that is perpendicular to the planar article contacting surface areas of said second member portion, such that said bores are oriented downwardly and in the direction of initial advancement of said second member portion into said magnetic field preparatory to the step of receiving articles respectively therewithin.

27. An apparatus in accordance with claim 25 wherein said bores are each formed in said insert at a predetermined angle of inclination, relative to an imaginary axis that is perpendicular to the planar article contacting surface areas of said insert, such that said bores are oriented downwardly and in the direction of initial advancement of said insert into said magnetic field preparatory to the step of receiving articles respectively therewithin.

28. An apparatus in accordance with claim 23 wherein said magnetic field is oriented at a predetermined angle relative to an imaginary axis that is perpendicular to the planar surface areas of said first and second member portions, and with the angle of inclination of the flux lines being viewed as directed downwardly and in the direction of movement of said second member portion as they pass therethrough.

29. An apparatus in accordance with claim 25 further comprising:

vertically reciprocal nest means positioned at said unloading station, and adapted to support and vertically displace a workpiece into close proximity with the underside of said stop plate means, thereby, facilitating the reliable transfer of said bore-confined articles into respectively aligned receiving areas of an associated workpiece, upon the array of apertures in said stop plate means being brought into registry with said bores of the insert.

30. An apparatus in accordance with claim 25 wherein said magnetic field is oriented at a predetermined angle relative to an imaginary axis that is perpendicular to the planar surface areas of said first and second member portions, and with the angle of inclination of the flux lines being viewed as directed downwardly and in the direction of movement of said second member portion as they pass therethrough.

31. An apparatus in accordance with claim 29 wherein said magnetic field is oriented at a predetermined angle relative to an imaginary axis that is perpendicular to the planar surface areas of said first and second member portions, and with the angle of inclination of the flux lines being viewed as directed downwardly and in the direction of movement of said second member portion as they pass therethrough.

32. An apparatus in accordance with claim 29 wherein said bores are each formed in said insert at a predetermined angle of inclination, relative to an imaginary axis that is perpendicular to the planar article contacting surface areas of said insert, such that said bores are oriented downwardly and in the direction of initial advancement of said insert into said magnetic field preparatory to the step of receiving articles respectively therewithin.

33. An apparatus in accordance with claim 24 wherein said means of stored articles are further confined within the magnetic field by positioning a non-magnetic shield between the upper ends of the articles and the adjacent pole face of the upper magnet, with the distance between said shield and the adjacent pole face of the upper magnet being greater than the distance between the upper planar surface areas of the first and second member portions and the adjacent pole face of the lower magnet, and wherein the mutually disposed pole faces of the magnets are of opposite polarity.

34. An apparatus in accordance with claim 24 wherein said planar member is resiliently mounted for reciprocal movement, and wherein said apparatus further includes vibratory means coupled to said member so as to impart vibratory motion thereto at a frequency and intensity sufficient to facilitate the magnetic attraction of certain ones of said stored mass of articles respectively into different ones of the receiving bores of said second member portion.

35. An apparatus in accordance with claim 33 further comprising:

a reciprocally mounted strand assembly, including at least one non-magnetic strand, positioned at an elevation near the upper ends of the mass of stored articles such that when said strand is reciprocally moved along a plane parallel to said member, it periodically brushes against upper end regions of at least certain ones of the articles, causing those articles to slightly tilt alternately in opposite directions so as to facilitate the magnetic attraction of different ones of the stored mass of articles into respective ones of the receiving bores of said second member portion.

36. An apparatus in accordance with claim 33 wherein the upper ends of said bores are chamfered, and wherein said apparatus further includes:

a third permanent magnet positioned above the upper one of said pair of magnets, and being spaced from said upper magnet a predetermined distance so as to define an auxiliary magnetic field-defined storage area within which articles may be periodically bulk-supplied, prior to being periodically transferred to the storage area defined in part between said upper and lower pair of magnets.

37. An apparatus particularly adapted to successively load a predetermined number of elongated paramagnetic articles out of a mass thereof into precisely spaced arrays, for subsequent transfer to an unloading station, whereat each array of articles is unloaded, such as into an aligned array of receiving areas of an associated workpiece, said apparatus comprising:

a mutually disposed pair of upper and lower permanent magnets for establishing a uniform magnetic field therebetween, and wherein the mutually opposed pole faces of said magnets are of opposite polarity and, in part, define a temporary article storage area of predetermined cross-section and height therewithin;

a reciprocally mounted assembly, including a substantially planar member made of a non-magnetic material, said member having first and second portions that are juxtaposed in the direction of movement of said assembly, with said second portion including a non-magnetic replaceable insert formed with a predetermined array of article-receiving bores that extend therethrough, said insert being seated within an accommodating opening formed in and coplanar with said second member portion, and said member being dimensioned and mounted for travel relative to said magnetic field such that at least a part of said first portion and all of said insert may be selectively confined within said field, said magnetic field and insert also being oriented relative to each other such that the planar surfaces of the insert area at least substantially perpendicular to the lines of force of the field, and with said member further being positioned at an elevation within said field so as to both define the lower effective boundary of said temporary article storage area, and insure that the mass of stored articles are only magnetically attracted at one of their respective ends against an upper surface of said member at all times, such that upon the advancement of said first member portion from a position initially at least substantially within said magnetic field, to a position beyond the influence of said field, said insert is moved completely into said field, causing different ones of said mass of stored articles to be magnetically attracted to, and initially confined at a predetermined depth within, respective ones of said insert bores, with the subsequent withdrawal of said insert with an array of loaded articles from the influence of said magnetic field resulting in said articles being positioned at the unloading station, and reciprocally mounted stop plate means positioned adjacent the underside of at least said insert at the unloading station, said stop plate being formed with an array of apertures corresponding at least spatially with, but normally offset with respect to the array of bores in said insert, said stop plate being movable transversely of said insert so as to allow the array of bores and the array of apertures to be brought into registry and, thereby, allow an array of articles confined within said bores to be simultaneously released therefrom.

38. An apparatus in accordance with claim 37 further including:

a non-magnetic shield positioned between the upper common ends of a mass of stored articles and the adjacent pole face of the upper magnet, with the distance between said shield and the adjacent pole face of the upper magnet being greater than the distance between the upper planar surface areas of the first and second member portions and the adjacent pole face of the lower magnet, and wherein the mutually disposed pole faces of the magnets are of opposite polarity, and vertically reciprocal nest means positioned at said unloading station, and adapted to support and vertically displace a workpiece into close proximity with the underside of said stop plate means, thereby facilitating the reliable transfer of bore-confined articles into respectively aligned receiving areas of an associated workpiece, upon the array of apertures in said stop plate means being brought into registry with said bores of the insert.

39. An apparatus in accordance with claim 38 wherein the upper peripheral edges of said bores formed in said insert are chamfered, and wherein said bores and said magnetic field established between said pair of magnets are selectively oriented at a predetermined angle between 1 and 5 degrees, relative to an imaginary axis that is perpendicular to the upper planar surface area of said insert, such that the resulting angle of inclination is viewed as extending downwardly and in the direction of initial advancement of said insert into said magnetic field to receive an array of articles within the bores thereof.

40. An apparatus in accordance with claim 39 further including:

a third permanent magnet positioned above the upper one of said pair of magnets, and being spaced from said upper magnet a predetermined distance so as to define an auxiliary magnetic field-defined storage area within which articles may be periodically bulk-supplied, prior to being periodically transferred to the storage area defined in part between said upper and lower pair of magnetics.

41. An apparatus in accordance with claim 39 further including:

a reciprocally mounted strand assembly including a non-magnetic frame member for supporting a plurality of non-magnetic strands disposed in parallel relation, and in a common plane, said strands being positioned at an elevation near the upper ends of the stored mass of articles such that when said strands are reciprocally moved along a plane parallel to said planar member, they periodically brush against upper end regions of at least certain ones of the articles, thereby, causing those articles to slightly tilt alternately in opposite directions so as to facilitate the magnetic attraction of different ones of the stored mass of articles into respective ones of the receiving bores of said insert.

* * * * *